(12) United States Patent
Helm et al.

(10) Patent No.: US 7,492,227 B1  
(45) Date of Patent: Feb. 17, 2009

(54) METHOD AND APPARATUS FOR INCREASING EFFICIENCY OF ELECTRICAL SYSTEMS

(75) Inventors: Brian P. Helm, Sachse, TX (US); Scott M. Heston, Dallas, TX (US); John G. Heston, Murphy, TX (US)

(73) Assignee: Raytheon Company, Waltham, MA (US)

( * ) Notice: Subject to any disclaimer, the term of this patent is extended or adjusted under 35 U.S.C. 154(b) by 365 days.

(21) Appl. No.: 11/411,535

(22) Filed: Apr. 26, 2006

(51) Int. Cl.
*H03F 3/04* (2006.01)
*G01S 13/00* (2006.01)

(52) U.S. Cl. .................. 330/296; 342/175

(58) Field of Classification Search .......... 342/175, 342/198; 330/285, 133, 296, 310, 134
See application file for complete search history.

(56) References Cited

U.S. PATENT DOCUMENTS

| | | | |
|---|---|---|---|
| 6,759,906 B2 * | 7/2004 | Matsunaga et al. | 330/285 |
| 6,943,631 B2 * | 9/2005 | Scherrer et al. | 330/310 |
| 7,095,285 B1 * | 8/2006 | Heston et al. | 330/296 |
| 7,221,217 B2 * | 5/2007 | Choi et al. | 330/98 |

\* cited by examiner

*Primary Examiner*—Isam Alsomiri  
(74) *Attorney, Agent, or Firm*—Baker Botts L.L.P.

(57) ABSTRACT

In accordance with the teachings of the present invention, a method and apparatus for increasing the efficiency of electrical systems are provided. In a particular embodiment, the apparatus comprises a first electrical component including a self-biasing resistor and at least one input terminal coupled to a power supply, and a second electrical component including at least one input terminal coupled to an output terminal of the first electrical component, and an electrical short circuit connected across the self-biasing resistor in the first electrical component such that current from the power supply bypasses the self-biasing resistor.

21 Claims, 2 Drawing Sheets

METHOD AND APPARATUS FOR INCREASING EFFICIENCY OF ELECTRICAL SYSTEMS

TECHNICAL FIELD

The present application relates generally to electrical componentry and, more particularly, to a method and apparatus for increasing the efficiency of electrical systems.

BACKGROUND

In radar systems and other electrical devices, system weight is often a design consideration. Previously designers have attempted to reduce system weight by reducing the power supplied to the electrical components, which allows the system may be fabricated using thinner DC routing lines and smaller DC power supplies. Because power is equal to the product of voltage and current, this may be accomplished by reducing the operating voltage and/or current flowing through the component. However, the ability to accomplish this has been limited by the fact that current power supply technology has been unable to design power supplies that are both stable and efficient at low voltage levels (i.e., less that one volt).

SUMMARY OF THE INVENTION

In accordance with the teachings of the present invention, a method and apparatus for increasing the efficiency of electrical systems are provided. In a particular embodiment, the apparatus comprises a first electrical component including a self-biasing resistor and at least one input terminal coupled to a power supply, a second electrical component including at least one input terminal coupled to an output terminal of the first electrical component, and an electrical short circuit connected across the self-biasing resistor in the first electrical component such that current from the power supply bypasses the self-biasing resistor. In a particular embodiment, the method comprises coupling a power supply to at least one input terminal of a first electrical component, coupling at least one output terminal of the first electrical component to at least one input terminal of a second electrical component such that the first and second components are electrically connected in series, and coupling an electrical short circuit across a self-biasing resistor on the first electrical component such that current from the power supply bypasses the self-biasing resistor.

A technical advantage of particular embodiments of the present invention includes the ability to electrically "stack" DC power supply voltages above one volt while allowing individual sub-components to operate at extremely low voltages (i.e., less than one volt). This allows for smaller, cheaper DC power supplies that operable stably and more efficiently.

Another technical advantage of particular embodiments of the present invention includes the ability to raise the operating voltage of a component while maintaining a low DC current. This allows the use of thinner DC routing lines, which helps to reduce overall system weight.

It will be understood that the various embodiments of the present invention may include some, all, or none of the enumerated technical advantages. In addition other technical advantages of the present invention may be readily apparent to one skilled in the art from the figures, description, and claims included herein.

BRIEF DESCRIPTION OF THE DRAWINGS

For a more complete understanding of the present invention and features and advantages thereof, reference is now made to the following description, taken in conjunction with the accompanying drawings, in which.

DETAILED DESCRIPTION OF EXAMPLE EMBODIMENTS

In accordance with the teachings of the present invention, a method and apparatus for increasing the efficiency of electrical systems are provided. In a particular embodiment, the apparatus comprises a first electrical component including a self-biasing resistor and at least one input terminal coupled to a power supply, a second electrical component including at least one input terminal coupled to an output terminal of the first electrical component, and an electrical short circuit connected across the self-biasing resistor in the first electrical component such that current from the power supply bypasses the self-biasing resistor. In a particular embodiment, the method comprises coupling a power supply to at least one input terminal of a first electrical component, coupling at least one output terminal of the first electrical component to at least one input terminal of a second electrical component such that the first and second components are electrically connected in series, and coupling an electrical short circuit across a self-biasing resistor on the first electrical component such that current from the power supply bypasses the self-biasing resistor. By electrically stacking components, such as low-noise amplifiers, particular embodiments of the present invention are able to increase the operating voltage of the system while maintaining a low DC current. In particular embodiments, this may facilitate the reduction of overall system weight.

Figure 1:
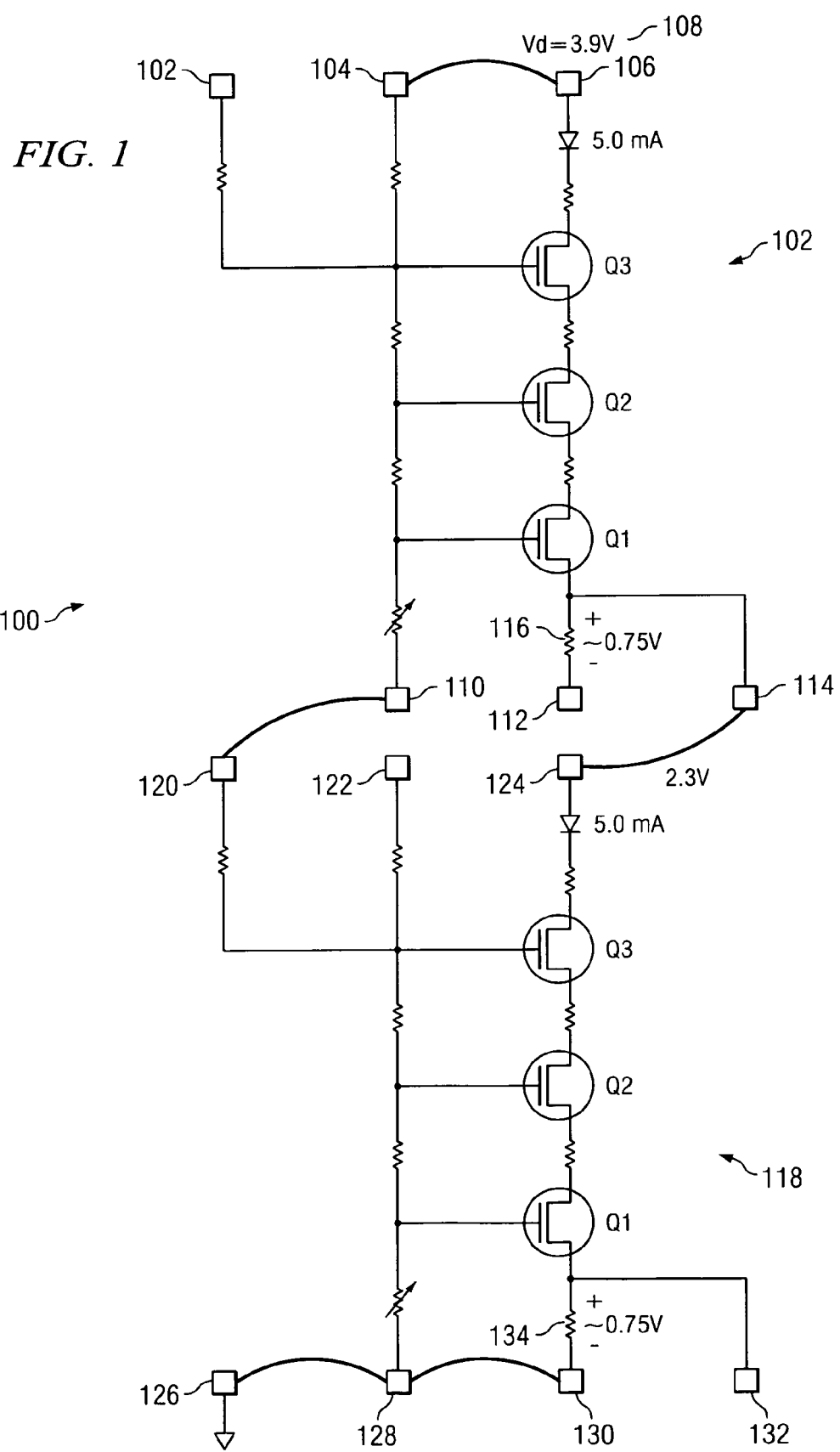
FIG. 1 is a schematic diagram illustrating an amplifier system in accordance with a particular embodiment of the present invention.

FIG. 1 illustrates an electrically stacked amplifier system 100 in accordance with a particular embodiment of the present invention. Generally, amplifier system 100 is an low-noise amplifier system that may be used in a radar system or other electrical system where weight is a design consideration. As shown in FIG. 1, amplifier system 100 comprises a first low-noise amplifier 102 and a second low-noise amplifier 118. In particular embodiments, such as that shown in FIG. 1, amplifiers 102 and 118 may be substantially identical, although they need not be. Furthermore, although FIG. 1 illustrates electrically stacked amplifiers, it should be understood by one of ordinary skill in the art that the teachings of the present invention may be applied to any electrical componentry. Additionally, although amplifier system 100 is illustrated as including only two amplifiers 102, 118 it should be understood that the teachings of the present invention may be extended to other systems including more than two components Generally first low-noise amplifier 102 includes a plurality of input terminals 102, 104, and 106 and a plurality of output terminals 110, 112, and 114. First amplifier 102 also includes a self-biasing resistor 116 adjacent to output terminal 112. However, by connecting to output terminal 114 rather than output terminal 112, self-biasing resistor 116 may be bypassed by current flowing through first amplifier 102.

Similarly, second low-noise amplifier 118 also includes a plurality of input terminals 120, 122, and 124 and a plurality of output terminals 128, 130, and 132. Like first amplifier 102, second amplifier 118 also includes a self-biasing resistor 134 adjacent to output terminal 130. However, by connecting to output terminal 132 rather than output terminal 130, self-biasing resistor 134 may be bypassed by current flowing through second amplifier 118.

First amplifier 102 and second amplifier 118 are connected in series such that the current passing through first amplifier 102 is substantially similar to the current passing through second amplifier 118. As shown in FIG. 1, this is accomplished by connecting input terminals 104 and 106 of first amplifier 102 to a power source 108. Output terminals 110 and 114 of first amplifier 102 are connected to input terminals 120 and 124 of second amplifier 118, respectively. In this manner, the current flowing through first amplifier 102 bypasses self-biasing resistor 116. In second amplifier 118, output terminals 128 and 130 are connected to ground 126, allowing current to flow through self-biasing resistor 134.

Figure 2:
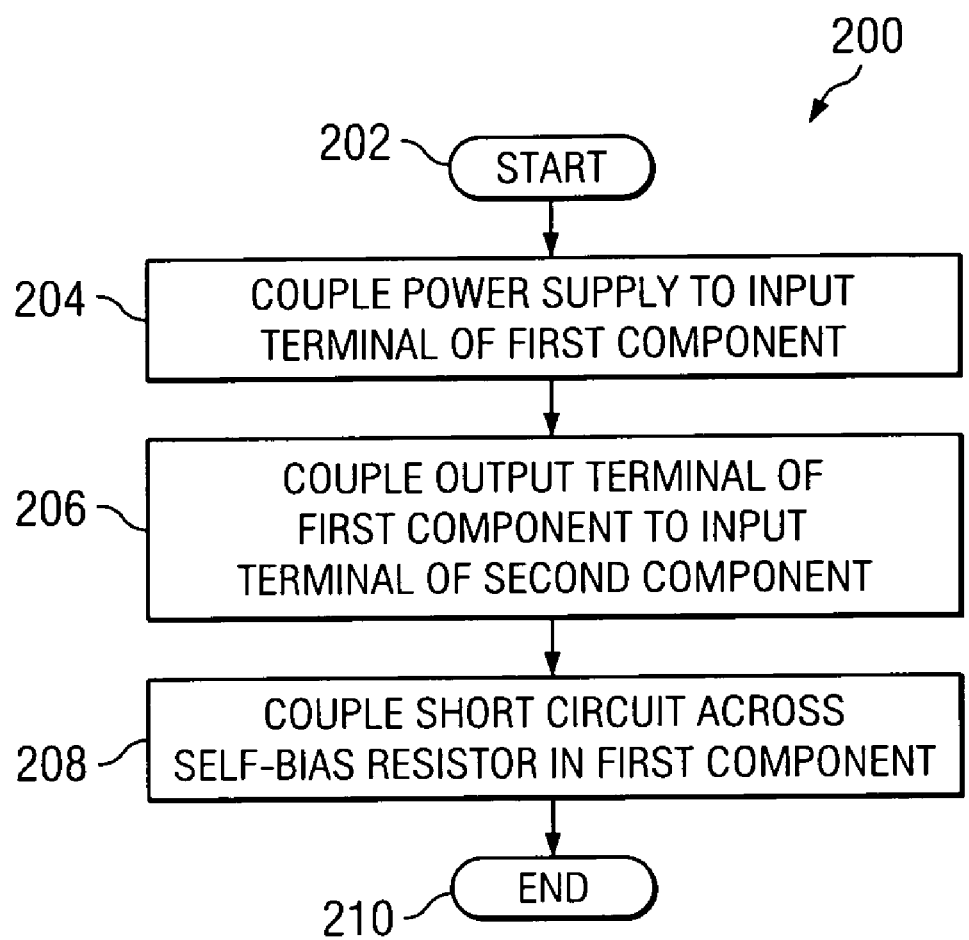
FIG. 2 is a flowchart illustrating a method of increasing the efficiency of an electrical system in accordance a particular embodiment of the present invention.

For a better understanding of the present invention, FIG. 2 illustrates a flowchart 200 of a method of increasing the efficiency of electrical components in accordance with a particular embodiment of the present invention. Flowchart 200 begins at step 202. Thereafter, a power supply is coupled to the input terminals of a first component at step 204. At step 206, the output terminals of the first component are coupled to the input terminals of a second component, such that the first and second components are connected in series. At step 208, the self-biasing resistor of the first component is bypassed. Then, at step 210, flowchart 200 terminates.

By connecting, or "electrically stacking," amplifiers in this fashion, particular embodiments of the present invention are able to increase, or "stack," the operating voltage of the individual amplifiers while operating at the same or reduced DC power. In particular embodiments of the present invention where the DC power is reduced, this may allow for significant weight savings due to the ability to use thinner, and therefore lighter, DC routing lines and/or small, cheaper DC power supplies. These weight savings may be particularly advantageous in radar systems, where system weight is a major concern. Additionally, stacked amplifiers in accordance with the teachings of the present invention may also exhibit RF performance similar to that of non-stacked amplifiers.

Although particular embodiments of the method and apparatus of the present invention have been illustrated in the accompanying drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. A voltage-stacked electrical device, comprising:
   a first electrical component including a self-biasing resistor and at least one input terminal coupled to a power supply;
   a second electrical component including at least one input terminal coupled to an output terminal of the first electrical component; and
   an electrical short circuit connected across the self-biasing resistor in the first electrical component such that current from the power supply bypasses the self-biasing resistor.

2. The device of claim 1, wherein the first electrical component comprises a low-noise amplifier.

3. The device of claim 1, wherein the second electrical component comprises a low-noise amplifier.

4. The device of claim 1, wherein the power supply comprises a DC power supply.

5. The device of claim 1, wherein the first and second electrical components are coupled in series.

6. The device of claim 1, wherein the first and second electrical components are identical.

7. The device of claim 1, wherein the voltage-stacked electrical device is suitable for use in a radar system.

8. A voltage-stacked electrical device, comprising:
   a power supply;
   a first electrical component including a self-biasing resistor and at least one input terminal coupled to the power supply;
   a second electrical component including at least one input terminal coupled to an output terminal of the first electrical component; and
   an electrical short circuit connected across the self-biasing resistor in the first electrical component such that current from the power supply bypasses the self-biasing resistor.

9. The device of claim 8, wherein the first electrical component comprises a low-noise amplifier.

10. The device of claim 8, wherein the second electrical component comprises a low-noise amplifier.

11. The device of claim 8, wherein the power supply comprises a DC power supply.

12. The device of claim 8, wherein the first and second electrical components are coupled in series.

13. The device of claim 8, wherein the first and second electrical components are identical.

14. The device of claim 8, wherein the voltage-stacked electrical device is suitable for use in a radar system.

15. A method of electrically stacking voltage of electrical components, comprising:
   coupling a power supply to at least one input terminal of a first electrical component;
   coupling at least one output terminal of the first electrical component to at least one input terminal of a second electrical component such that the first and second components are electrically connected in series; and
   coupling an electrical short circuit across a self-biasing resistor on the first electrical component such that current from the power supply bypasses the self-biasing resistor.

16. The method of claim 15, wherein the first electrical component comprises a low-noise amplifiers.

17. The method of claim 15, wherein the second electrical component comprises a low-noise amplifier.

18. The method of claim 15, wherein the power supply comprises a DC power supply.

19. The method of claim 15, wherein the first and second electrical components are coupled in series.

20. The method of claim 15, wherein the first and second electrical components are identical.

21. The method of claim 15, further comprising utilizing the first and second electrical components in a radar system.

* * * * *